United States Patent [19]

Melanson et al.

[11] 4,106,011
[45] Aug. 8, 1978

[54] KEYBOARD CIRCUIT

[75] Inventors: John Laurence Melanson, Boulder, Colo.; Richard Allen Springer, Beaverton, Oreg.; Jack Duane Grimes, Tualatin, Oreg.; Jack Arthur Gilmore, Aloha, Oreg.

[73] Assignee: Tektronix, Inc., Beaverton, Oreg.

[21] Appl. No.: 625,611

[22] Filed: Oct. 24, 1975

[51] Int. Cl.² ............................................. G08C 25/00
[52] U.S. Cl. ................................ 340/365 E; 340/365 S
[58] Field of Search ............ 340/365 R, 365 E, 365 S; 178/17 R, 17 C, 69 G, 69 B, 70 R, 23 A, 17 A; 307/247 A, 232, 234

[56] References Cited

U.S. PATENT DOCUMENTS

| | | | |
|---|---|---|---|
| 3,448,254 | 6/1969 | Verhoeff | 340/365 E |
| 3,675,239 | 7/1972 | Ackerman et al. | 340/365 E |
| 3,790,881 | 2/1974 | Smith | 307/234 |
| 3,792,466 | 2/1974 | Arnold et al. | 340/365 E |
| 3,803,592 | 4/1974 | Hatley | 340/365 S |
| 3,825,926 | 7/1974 | Brownback | 340/365 E |
| 3,828,258 | 8/1974 | Hills | 307/234 |
| 3,886,543 | 5/1975 | Marin | 340/365 E |
| 3,949,365 | 4/1976 | Kashio | 340/365 S |
| 3,973,256 | 8/1976 | Stoesser et al. | 340/365 E |

*Primary Examiner*—John W. Caldwell, Sr.
*Assistant Examiner*—James J. Groody
*Attorney, Agent, or Firm*—George T. Noe

[57] ABSTRACT

A simplified keyboard for a terminal device, calculator, or the like, in which each key is sequentially scanned and parallel key code data is sent to an entry register. A pair of flip-flops in combination with firmware ascertain that only valid key code data is sent to the entry register for utilization by the system, providing double entry and key bounce protection. The firmware further provides N-key rollover and auto repeat with a variable repeat rate, and expands the keyboard from a single-mode to an eight-mode capability.

4 Claims, 7 Drawing Figures

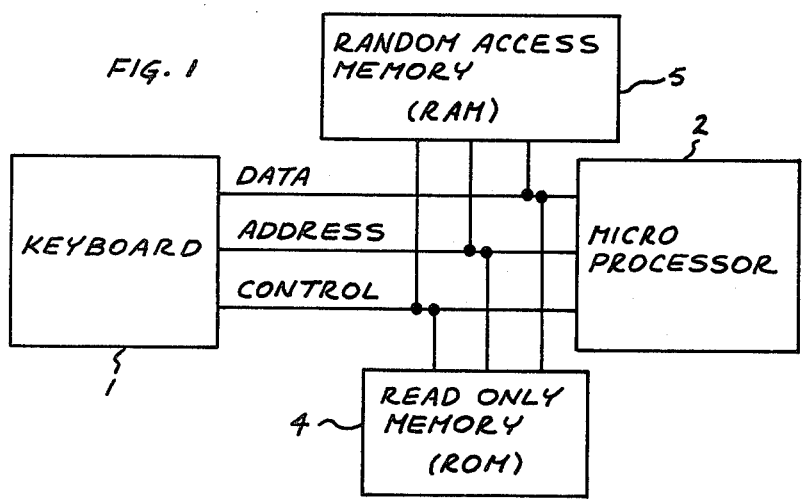
FIG. 1
J-K FLIP-FLOP TRUTH TABLE
| J | K | Q | Q̄ |
|---|---|---|---|
| 0 | 0 | NO CHANGE | |
| 0 | 1 | 0 | 1 |
| 1 | 0 | 1 | 0 |
| 1 | 1 | CHANGES STATE | |
| CLEAR | | 1 | 0 |
FIG. 3B
J-K FLIP-FLOP STATE DIAGRAM ($A_Q - B_Q$)
FIG. 3C
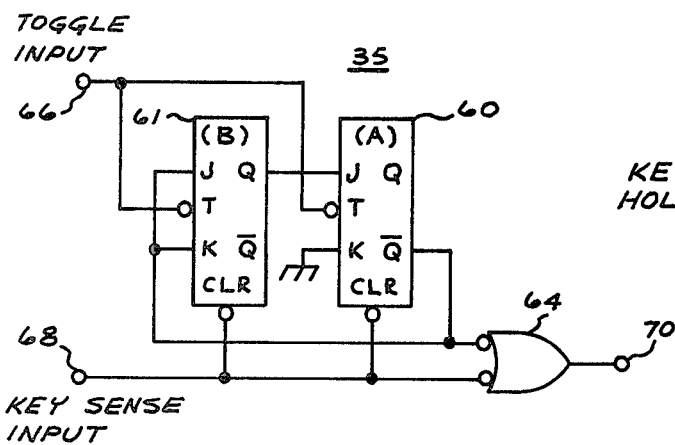
FIG. 3A
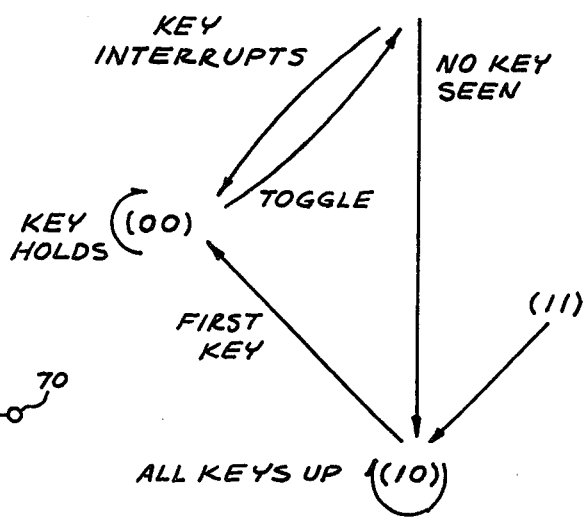
FIG. 3D

KEYBOARD CIRCUIT

BACKGROUND OF THE INVENTION

This invention relates to electronic keyboards in general and, more specifically, to keyboards with double entry protection and parallel encoding.

Conventional keyboard systems include momentary contact keys which may be represented schematically as matrices having rows and columns, each key of which is sequentially scanned at a rate determined by an internal clock. These systems have here-to-fore required relatively complex circuitry to facilitate parallel entry of data. Furthermore, the possibility of errors in the system is fairly high. For example, depressing a pair of keys simultaneously usually results in error entry. Other errors are introduced by key bounce, which is the mechanical vibratory action of the contact making and breaking, and ghosting effects when three adjacent keys forming a partial square on the matrix are pressed.

SUMMARY OF THE INVENTION

According to the present invention, an electronic keyboard is provided which utilizes firmware in combination with a simplified entry circuit to determine the validity of key code data. The key code comprises an array of keys which may be schematically represented as a matrix having rows and columns, each intersection of which corresponds to a key and is scanned in sequence to determine the state thereof. The scanning is performed through a decoder coupled to the rows and an encoder coupled to the columns by a pair of binary counters, whose count output corresponds to the codes of the keys of the keyboard and is monitored by the firmware.

A pair of interconnected J-K flip-flops complete the sequential machine, and are adapted to produce an interrupt signal when a key is down for two consecutive scanning cycles of the matrix. This interrupt signal is sensed by the firmware, which sends a latch signal to latch the counters long enough to read and process the parallel key code data. When keys are lifted, after having been down, an interrupt signal is produced to notify the firmware that all keys are up.

The firmware, which is in the form of a Read Only Memory (ROM), has instructions to keep track of key codes in response to the interrupt signals. It includes a memory stack which can store up to three key codes for 3-key rollover. When a key appears twice on the stack, it is issued to the processor or display screen as a valid key. If more than three keys are seen through a scanning cycle, no key is issued to the processor. If no keys are seen during a scanning cycle, the stack is cleared.

The firmware also provides a variable repeat rate and facilitates expansion of a single-mode keyboard into an eight-mode keyboard including upper and lower case functions, control key, shift, and TTY lock.

It is, therefore, one object of the present invention to provide a keyboard having double entry protection.

It is another object of the present invention to eliminate key bounce in a keyboard system.

It is a further object to provide a simplified entry circuit for parallel entry of data.

It is yet another object to provide a keyboard having N-key rollover.

It is yet a further object to provide a keyboard having auto repeat with a variable repeat rate.

It is still another object to expand a single-mode keyboard into an eight-mode keyboard.

It is still a further object to utilize instructions in a ROM to drive a keyboard.

This invention is pointed out with particularity in the appended claims. A more thorough understanding of the above and further objects and advantages of this invention may be obtained by referring to the following description taken in conjunction with the accompanying drawings.

BRIEF DESCRIPTION OF DRAWINGS

FIG. 1 is a general block diagram of a system utilizing a keyboard;

FIG. 3A is a schematic of the sequential machine including a pair of interconnected J-K flip-flops and a NOR gate;

FIG. 3B shows the truth table of the J-K flip-flops of FIG. 2A;

FIG. 3C shows a state diagram of the J-K flip-flops of FIG. 2A;

FIG. 3D shows a ladder diagram of the operation of the J-K flip-flops of FIG. 2A.

DETAILED DESCRIPTION OF THE INVENTION

Turning now to the drawings, a general block diagram of a system utilizing a keyboard is shown in FIG. 1. A keyboard 1 is shown interconnected with a microprocessor which directs system operations as well as decodes instructions and performs arithmetic and logic operations. The instructions for the microprocessor are permanently fixed in the read only memory 4. Since these instructions are permanently fixed, the microprocessor instructions will be hereinafter referred to as "firmware". Typically, the microprocessor 2 receives an instruction from the ROM by placing an address on the address line. The ROM 4 responds by sending the instruction stored in that location to the microprocessor 2 over the data line. The microprocessor decodes and executes the instruction. The random Access Memory (RAM) 5 is utilized to temporarily store data, program instuctions, and intermediate processing results for arithmetic operations. The RAM 5 also holds data and programs entered into the system from the keyboard 1, and thus has the flexibility to permit information to be changed or replaced at any time. Such a system, as shown in FIG. 1, may be expanded to include other peripheral devices, such as a display device or the like.

Figure 2:
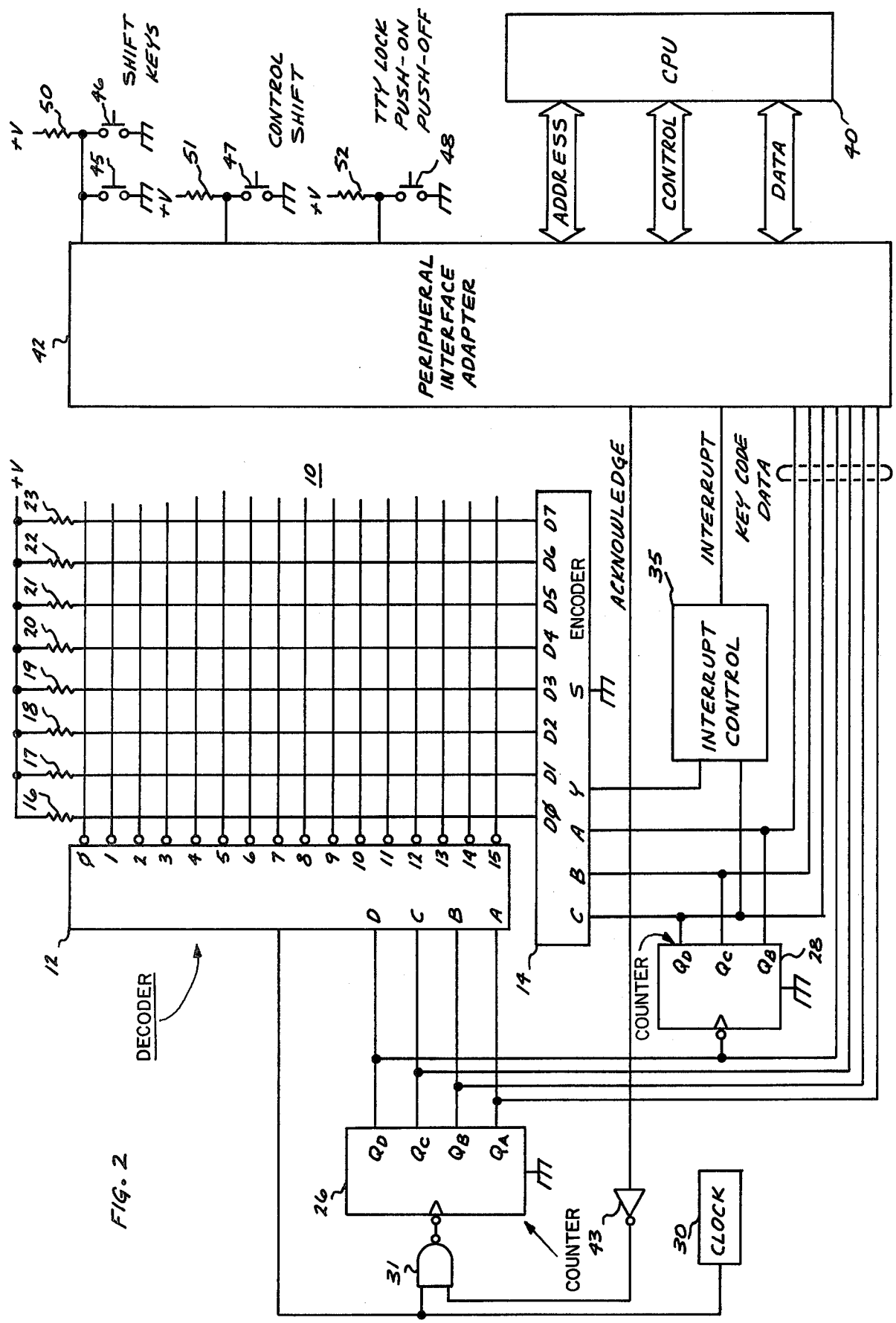
FIG. 2 is a schematic of a keyboard according to the present invention.

FIG. 2 is a schematic of a keyboard according to the present invention. The keyboard itself is represented as a matrix 10, which consists of electrical intersections arranged in columns and rows. When the keys are up, these intersections are open, and when the keys are down, these intersections are closed, or shorted together. A decoder 12 is connected to the rows, and an encoder 14 is connected to the columns. Decoder 12 may suitably be a commercially available 74159 integrated circuit, and encoder 14 may suitably be a commercially available 74151 integrated circuit. The active state of the decoder 12 is a low on lines 0 through 15 while lines DO through D7 are returned to a suitable source of positive voltage, e.g., positive 5 volts, through resistors 16–23.

The decoder 12 and encoder 14 are driven by a pair of binary counters 26 and 28, which may suitably be commercially available 7493 integrated circuits. Counter 26 is operated by a clock 30 via a NAND gate 31. The counter 26 and 28 are arranged such that each intersection of the matrix is scanned seuentially by columns and rows, as is well known in the art.

When a key is pushed down, the intersection corresponding to that key is shorted together, and when that particular column andd row are enabled during the scanning sequence, a low will be transferred to the Y output of the encoder 14. The Y output of encoder 14 is connected to an interrupt control circuit 35. The interrupt control circuit is also adapted to receive the overflow from counter 28, so that when the scanning cycle is complete the interrupt control circuit 35 is notified. The interrupt control circuit 35, which will be described in detail later, receives the information that a key is down during one scanning cycle but waits until a second scanning cycle before sending an interrupt signal to an associated central processing unit (CPU) 40 via a peripheral interface adaptor 42. The CPU 40 acknowledges receipt of the interrupt signal by sending a signal back to the keyboard to stop the scanning sequence at that key. The acknowledge signal is applied to NAND gate 31, disabling the clock signal input to counter 26. The binary counters 26 and 28, having stopped their counts at a particular key position, provide the binary count output as data to the CPU 40. The CUP 40 reads the data, and then releases the counters via the acknowledge line so that they may continue the scanning sequence. The CPU 40 includes a ROM and a RAM as described above under FIG. 1. The peripheral interface adaptor 42 may suitably be a commercially available Motorola MC 6820.

Included on the data bus, in addition to the key code data, is information relating to the mode in which the keyboard is operated. These modes include shift keys to permit two characters to be generated from a single key, the control key permits special functions to be entered, and the TTY lock key provides a mode in which all of the characters generated are upper case. These keys are represented in FIG. 2 as momentary contact switches 45 through 48. These output lines are normally held high through resistors 50 to 52 to a source of positive voltage. When any of the keys 45 through 48 are pressed, that particular line is grounded, and is read by the CPU as logical lows. This utilization of parallel data permits a single-mode keyboard to be implemented as an eight-mode keyboard.

The data on the data lines is read by the CPU only upon receipt of an interrupt signal from the interrupt control circuit 35. This circuit will be described now with reference to FIGS. 3A – 3D. FIG. 3A shows the interrupt control circuit 35 which comprises a pair of J-K flip-flops 60 and 61, and a NOR gate 64. A first input terminal 66 receives the input from binary counter 28, as described previously, and a second input terminal 68 receives the key sense information from encoder 14, as described previously. The interrupt signal which is generated is available at output terminal 70. The circuit action will now be described with reference to the truth table, the state diagram, and the waveform ladder diagram. Initially, the interrupt control circuit 35 is in an idle state (10) which is defined as the state of the Q outputs of flip-flops 60 and 61 respectively. In the idle state, the toggle input 66 and the key sense input 68 both are in the high or 1-state. Since the $\overline{Q}$ output of flip-flop 60 is low (the complement of the Q output; see the truth table), terminal 70 is high.

Assume that during a scanning cycle of the keyboard matrix, a key-down condition is sensed. Terminal 68 goes low for one count, clearing the flip-flops enforcing the $\overline{Q}$ output of flip-flop 60 to go high. The output terminal 70 remains high until the next count at which terminal 68 goes high and terminal 70 goes low. At the end of the scanning cycle, terminal 66 goes low for one count, toggling both flip-flops. This causes the Q output of flip-flop 61 to go high. The interrupt control circuit 35 is now armed, and will produce an interrupt signal on the next scanning cycle if a key is down. If a key is not down, the interrupt control circuit 35 will return to the idle state. Assuming, however, that a key is sensed during the second scan, the low at terminal 68 causes the output terminal (70) to go high the and the Q output of flip-flop 61 to go low. The CPU recognizes the positive going edge at terminal 70 as an interrupt signal. The acknowledge signal is returned to the keyboard to latch the counters as described previously long enough for the CPU to read the key code information. The counters are then released to continue the scanning cycle through the matrix. At the end of the scanning cycle, terminal 66 goes low, toggling the flip-flops, causing the Q output of flip-flop 61 to go high. The $\overline{Q}$ output of flip-flop 60 will remain high as long as a key is sensed on each scanning cycle, and the Q output of flip-flop 61 will alternate between high and low. Following the waveform action in FIG. 3D, it can be seen that if no keys are sensed during the third scanning cycle, flip-flops 60 and 61 are again toggled, returning the interrupt control circuit 35 to the idle state. When the $\overline{Q}$ output of flip-flop 60 goes low, the output terminal 70 goes high, producing another interrupt signal. The CPU latches the counters and reads the data, which corresponds to the overflow of the counters. This is interpretd by the CPU as a condition in which all the keys on the keyboard are up. The CPU can then clear its temporary storage registers.

Figure 4:
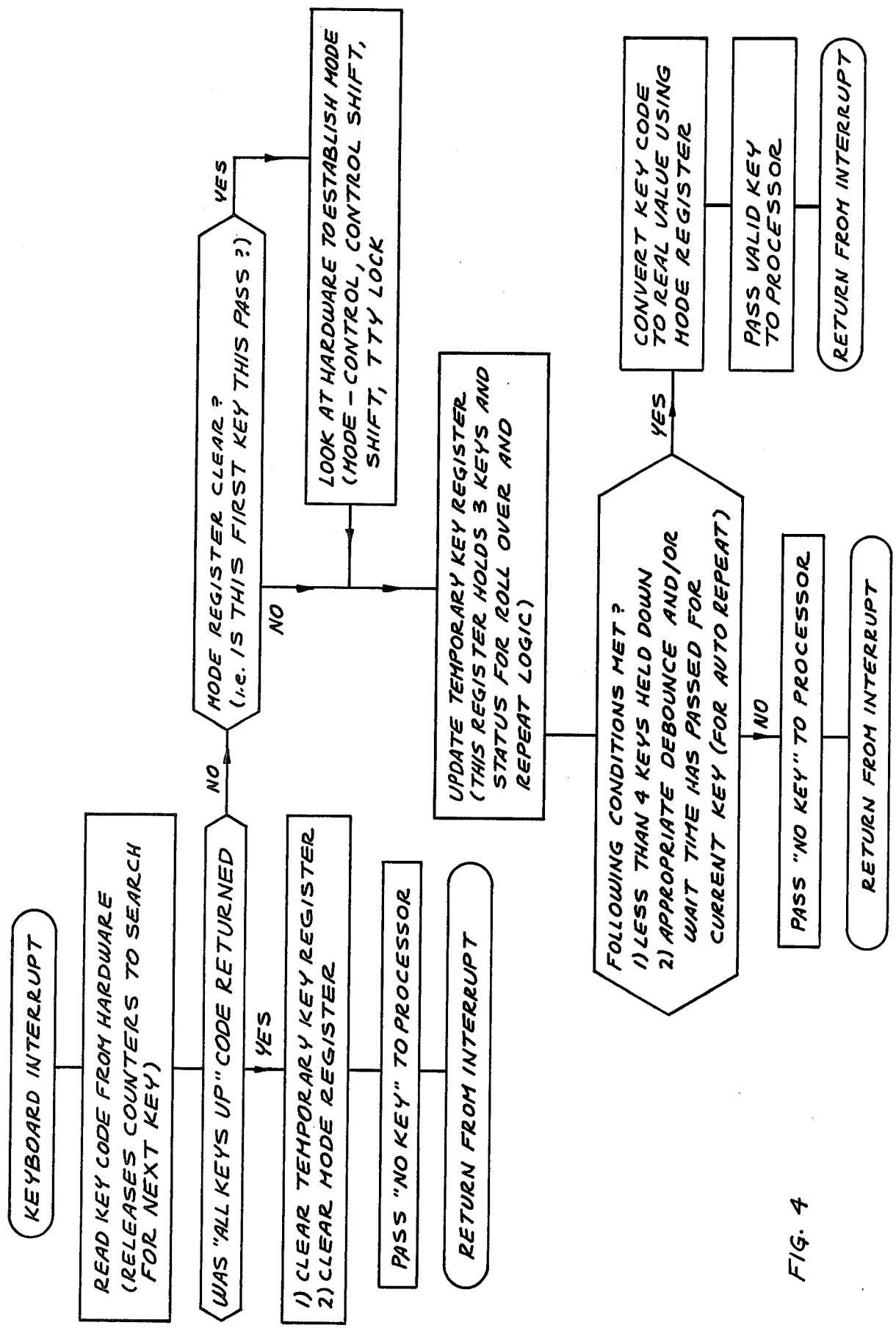
FIG. 4 shows a flow chart of the programmed instructions contained in the firmware.

As discussed previously, firmware is utilized in combination with the keyboard to insure that only valid key code data is sent to the processor. The firmware includes program instructions which are stored in a read only memory(ROM). FIG. 4 shows a flow chart of these instructions. The CPU includes a stack of registers for temporarily storing key code information. Up to three key codes may be stored for 3-key rollover. When the same key code appears twice on the stack, it is issued to the processor. If four keys are seen during a scanning cycle, no key code at all will be issued to the processor, protecting the processor from a possibility of error due to a phantom key. If no keys are seen through a scanning cycle of the keyboard matrix, the 3-key stack is cleared. The firmware also reads the mode data lines at each interrupt to establish the correct keyboard mode. The keyboard mode and key code information are converted from binary numbers to American Standard Code for Information Interchange (ASCII) for use by the processor. If the firmware senses that a key is to be repeated, that is, the key is held down through several scanning cycles of the keyboard matrix, an auto repeat mode is established whereby the key code information will be repeatedly issued to the processor after predetermined time intervals. These time intervals become shorter as the key is continuously held down so that the auto repeat rate is variably increased.

In summary, it can be seen that an interrupt control circuit 35 provides double-entry protection and eliminates the effects of key bounce in a keyboard, and that a keyboard in combination with firmware provides 3-key rollover, auto repeat with a variable repeat rate, and expands the keyboard from a single-mode to an eight-mode capability. Although the keyboard system of the invention has been described with reference to a specific embodiment, various modifications, as well as other embodiments of the invention, will become apparent to persons skilled in the art. It is, therefore, contemplated that the appended claims will not be construed in a limiting sense and will cover any such modifications or embodiments as fall within the true scope of the invention.

We claim:

1. A keyboard circuit for an associated data processing device, comprising:
   an array of keys;
   means for scanning cyclically said array of keys in a predetermined sequence and generating parallel keycode data corresponding to each key;
   interrupt control means for sensing a key depressed for two successive scans and generating an interrupt signal in response thereto; and
   means responsive to said interrupt signal for generating an acknowledge signal to stop said scanning at said depressed key on the second of said two successive scans and for reading and storing keycode data corresponding to said depressed key.

2. A keyboard circuit in accordance with claim 1 wherein said array of keys is schematically represented as a matrix having columns and rows and said means for scanning said array includes a clock, counter means responsive to said clock, encoder means responsive to said counter means for enabling said columns of said matrix in a predetermined sequence, and decoder means responsive to said counter means for activating said rows of said matrix in a predetermined sequence, each count of said counter means corresponding to an intersection of said columns and rows.

3. A keyboard circuit in accordance with claim 1 wherein said interrupt control means comprises a pair of J-K flip-flops and a NOR gate, wherein said pair of J-K flip-flops is cleared by a depressed key signal and toggled by an overflow signal at the end of each scanning cycle, and wherein said NOR gate generators said interrupt signal in response to the output of said pair of flip-flops and said depressed key signal.

4. A keyboard circuit in accordance with claim 1 wherein said means responsive to said interrupt signal includes a read-only memory containing a set of program instructions so that said keycode data is processed under program control.

* * * * *